United States Patent [19]
Chang

[11] 3,956,635
[45] May 11, 1976

[54] COMBINED MULTIPLE BEAM SIZE AND SPIRAL SCAN METHOD FOR ELECTRON BEAM WRITING OF MICROCIRCUIT PATTERNS

[75] Inventor: Tai-Hon Philip Chang, Chappaqua, N.Y.

[73] Assignee: International Business Machines Corporation, Armonk, N.Y.

[22] Filed: June 13, 1975

[21] Appl. No.: 586,697

[52] U.S. Cl. .............................. 250/492 A; 148/1.5; 219/121 EB
[51] Int. Cl.² ......................................... G01N 23/04
[58] Field of Search ................... 250/492 A; 29/584; 148/1.5; 219/121 EB

[56] References Cited
UNITED STATES PATENTS 3,547,074  12/1970  Hirschfeld...................... 250/492 A

OTHER PUBLICATIONS

"Application of Electron/Ion Beam Technology to Microelectronics," Brewer, IEEE Spectrum, Jan. 1971, pp. 23-37.

*Primary Examiner*—Craig E. Church
*Attorney, Agent, or Firm*—John W. Henderson, Jr.

[57] ABSTRACT

A method for electron beam writing of microcircuit patterns utilizing the combination of spiral scan techniques and variable beam sizes. The circuit patterns are outlined in a spiral scan motion using a small size beam in order to ensure good edge sharpness and accuracy. The beam is then increased in size to fill-in the inside area of the pattern. Increasing the beam size increases the beam current and, correspondingly, the exposure speed and system throughput.

10 Claims, 8 Drawing Figures

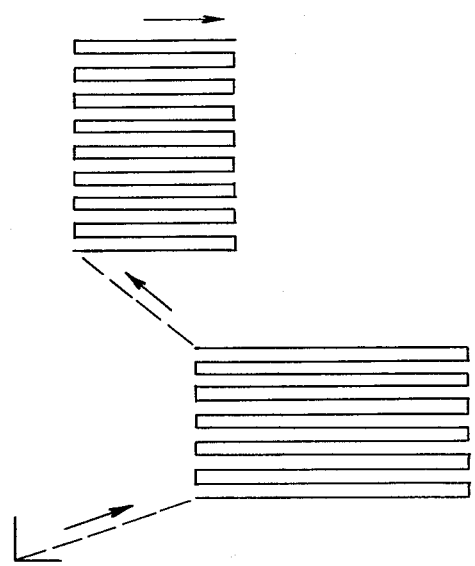
FIG. 1
PRIOR ART
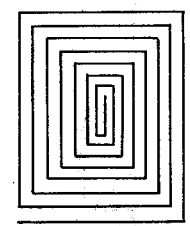
FIG. 2
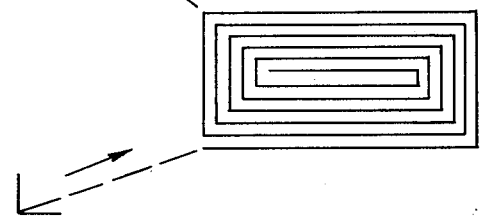
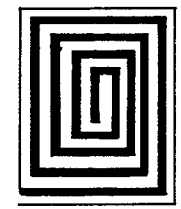
FIG. 3
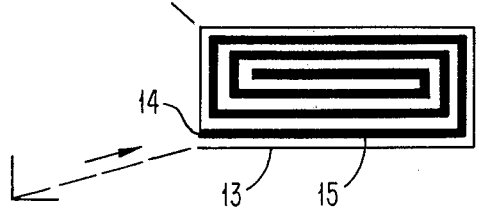

COMBINED MULTIPLE BEAM SIZE AND SPIRAL SCAN METHOD FOR ELECTRON BEAM WRITING OF MICROCIRCUIT PATTERNS

BACKGROUND OF THE INVENTION

1. Field of the Invention

This invention relates to fabrication of microelectronic circuit patterns, and more particularly to a method for controlling impingement of an electron beam on a target according to a predetermined pattern of integrated circuitry to be formed.

2. Description of the Prior Art

In fabricating integrated circuits by use of electron beam technology, the beam size and current constitute a significant factor in the efficient production of the microelectronic patterns. In the prior art, the microcircuit patterns are written by an electron beam machine in a vector scanning mode under computer control. The use of a computer to control electron beam microcircuit fabrication is well known in the prior art. For example, a computer controlled electron beam microcircuit fabrication system is described in "A Computer-Controlled Electron-Beam Machine for Microcircuit Fabrication", by T. H. P. Chang and B. A. Wallman, in IEEE Transactions on Electron Devices, May 1972, at pages 629–635.

In the vector scan mode of computer controlled circuit pattern writing, the pattern is divided into a series of rectangles and parallelograms. The electron beam is then controlled by the computer to access these rectangles and parallelograms sequentially and to expose the inside of them. At present, the exposure is performed by scanning the beam of a final size inside each rectangle and polygon in a raster manner as shown in FIG. 1. In order to ensure good edge sharpness and accuracy, a relatively small beam size has to be used, typically one-fourth to one-fifth of the smallest linewidth of the pattern.

Throughput of such a system is dependent on the speed at which the semiconductor wafer can be exposed by the electron beam. Since exposure speed is limited by the current delivered to the wafer surface by the beam and beam current is determined by beam size, one of the major drawbacks of such a system is the limitation on throughput necessitated by the small beam size required to ensure edge sharpness and accuracy. Prior art systems attempted to solve this problem by making trade-offs between beam size on the one hand and edge definition and accuracy on the other. It was not feasible in the prior art to enlarge the size of the electron beam used to fill in the inside of the circuit pattern because the machine had to be powered down to change lens in order to change the beam size. Therefore, the prior art electron beam microcircuit fabrication machines were restricted to a speed determined by the electron beam size required for proper edge definition and accuracy.

OBJECTS OF THE INVENTION

It is an object of this invention to increase the throughput in an electron-beam microelectronic circuit fabrication system without sacrificing edge sharpness and accuracy.

It is a further object of this invention to dynamically increase the size of the electron beam used in microelectronic circuit fabrication.

SUMMARY OF THE INVENTION

In accordance with these objects a method of electron-beam microelectronic circuit fabrication is provided which comprises the combination of outlining the circuit pattern to be fabricated in a spiral scan motion using a beam of small diameter to ensure edge sharpness and accuracy and then increasing the beam diameter and continuing the spiral scan motion to fill in the inside of the pattern thus increasing the exposure speed.

The current delivered to the target surface by the electron-beam can be approximated by the following equation assuming that lens aberrations and defects are minimized:

$$I = \beta \pi^2 \alpha^2 d^2 / 4$$

where $\beta$ is the brightness of the electron gun, $\alpha$ is the semiangular aperture of the beam, and $d$ is the beam diameter. It can be readily seen from the above equation that the beam current increases with the square of the beam diameter and the square of the semiangular aperture. Thus, increasing the beam size or the semiangular aperture also increases the beam current and thus the exposure speed. This method effectively increases throughput by dynamically altering the beam size while on line without powering down the machine. In one embodiment, the method uses an electron optical imaging unit comprising two electrostatic "Einzel" lenses to control the beam size. The spacing and focal lengths of these two lenses are arranged such that control of the beam size over the required range is achieved with only a relatively small change in the potentials of the control electrodes of the lenses. High speed switching is attained because the capacitance of the lens electrodes is small.

In accordance with another embodiment of the invention, the beam size is varied by varying the size of the limiting aperture through which the beam passes. An array of required aperture sizes is provided on a special aperture tray and the electron beam is deflected into the appropriate aperture by electromagnetic or electrostatic deflection. Since high deflection speed can be attained by electrical deflection, this method will satisfy the high speed switching requirement.

BRIEF DESCRIPTION OF THE DRAWINGS

FIG. 1 illustrates a circuit pattern fabricated using the prior art constant beam size, raster scan fill-in technique.

FIG. 2 illustrates a circuit pattern fabricated using a vector-spiral scan method with constant beam size.

FIG. 3 is an illustration of the vector-spiral scan method with multiple beam size.

DETAILED DESCRIPTION

Figure 4:
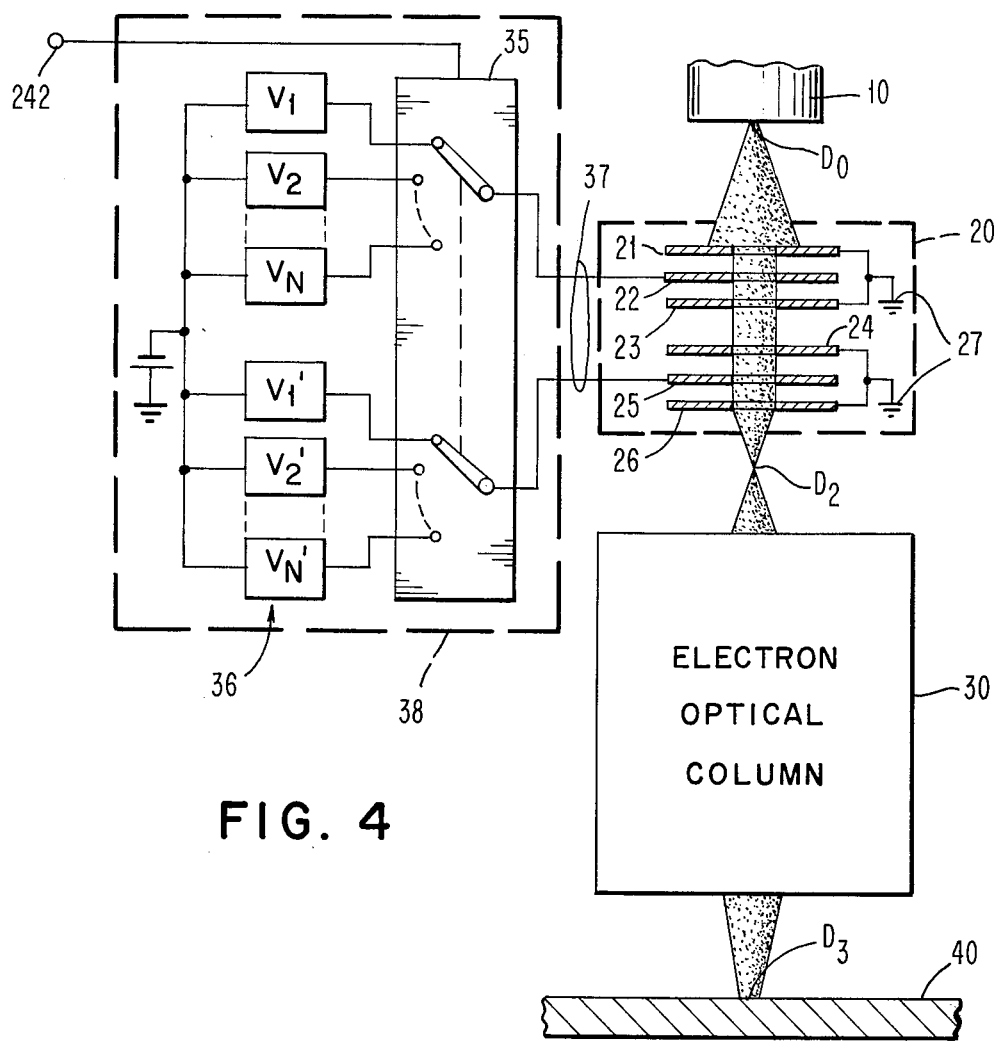
FIG. 4 shows the electron beam apparatus with twin Einzel lenses inserted between the electron gun and the electron optical column.

FIG. 4 illustrates the electron beam portion of an electron-beam microelectronic circuit fabrication apparatus. The apparatus is part of a typical computer controlled electron beam system, e.g., the system described in "Instrumentation for Electron Beam Lithography", by T. H. P. Chang in IEEE Transactions on Magnetics, Volumn MAG-10, No. 3, September 1974, at pages 883–887, except that an electron optical imaging unit 20 comprising twin Einzel lenses has been inserted between the electron gun 10 and the electron optical column 30 in order to accomplish the method of this invention of dynamically switching the beam size. Those of skill in the art recognize the Einzel lens as an electrostatic lens formed of three cylindrical discs having a circular aperture in the center. The two outside discs, 21 and 23 of the upper lens and 24 and 26 of the lower lens, are connected to ground potential 27 while the center disc of each lens, 22 of the upper lens and 25 of the lower lens, is connected to a control voltage supply 38 comprising a source of negative potential 36, typically close to the electron gun accelerating potential, and a variable switch network 35. The focal lengths of the Einzel lenses are controlled by varying the negative potential on the center discs 22 and 25 by a signal applied to the switch network 35 through cable 242.

Figure 5:
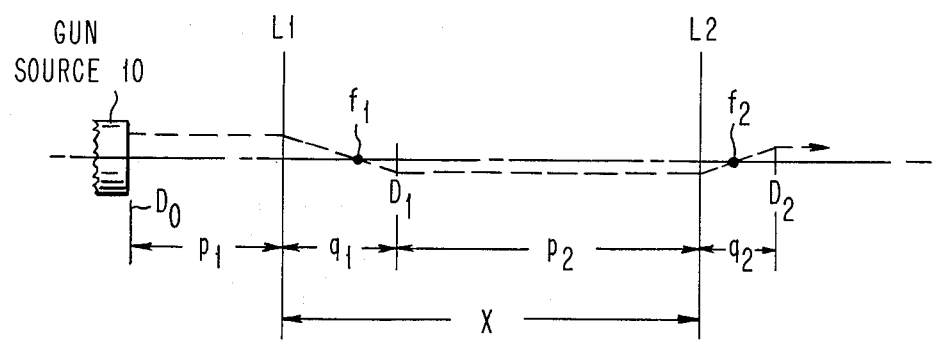
FIG. 5 illustrates the operation of the twin Einzel lenses of FIG. 4.

FIG. 5 illustrates the operation of the electron optical imaging unit 20. The electron beam of size $D_o$ is emitted by electron gun 10 and passes through the upper Einzel lens unit L1 where it is focused and imaged to size $D_1$. The lower Einzel lens unit L2 images $D_1$ to size $D_2$ at a predetermined plane distance $q_2$ from lens L2. The required operating condition is that the distance $q_2$ remain unchanged. The imaging properties of the two Einzel lenses are characterized by the basic relationships between lens distances and focal lengths given by the following equations:

$$\frac{1}{f_1} = \frac{1}{P_1} + \frac{1}{q_1} \qquad (1)$$

where $f_1$ is the focal length of lens L1, $P_1$ is the distance between gun source 10 and lens L1 and $q_1$ is the the distance between L1 and the image $D_1$; and $$\frac{1}{f_2} = \frac{1}{P_2} + \frac{1}{q_2} \qquad (2)$$

where $f_2$ is the focal length of lens L2, $P_2$ is the distance from image $D_1$ to lens L2 and $q_2$ is the distance from lens L2 to image $D_2$.

If the magnification ratio M of the twin Einzel lens unit 20 is $D_2 D_o$ then the following equation can be derived from basic equations 1 and 2 to express the magnification ratio M and focal length $f_2$ of lens L2 in terms of the focal length $f_1$ of lens L1:

$$\frac{1}{M} = \frac{x(P_1-f_1)}{q_2 f_1} - \frac{P_1}{q_2} \qquad (3)$$

$$\frac{1}{f_2} = \frac{P_1-f_1}{x(P_1-f_1)-f_1 P_1} + \frac{1}{q_2} \qquad (4)$$

where $x$ is the distance between lenses L1 and L2. For a given value of $P_1$, $x$, and $q_2$ the magnification ratio of the lens unit 20 and the focal length $f_2$ of lens L2 vary with changes in the focal length $f_1$ of lens L1. Since changes in the focal length of lens L1 and L2 are effected by changing the magnitude of the negative bias voltages on the center discs 22 and 25 of lens L1 and L2, the magnification ratio of the lens unit 20 and the beam size can be controlled by these two voltages.

Figure 6:
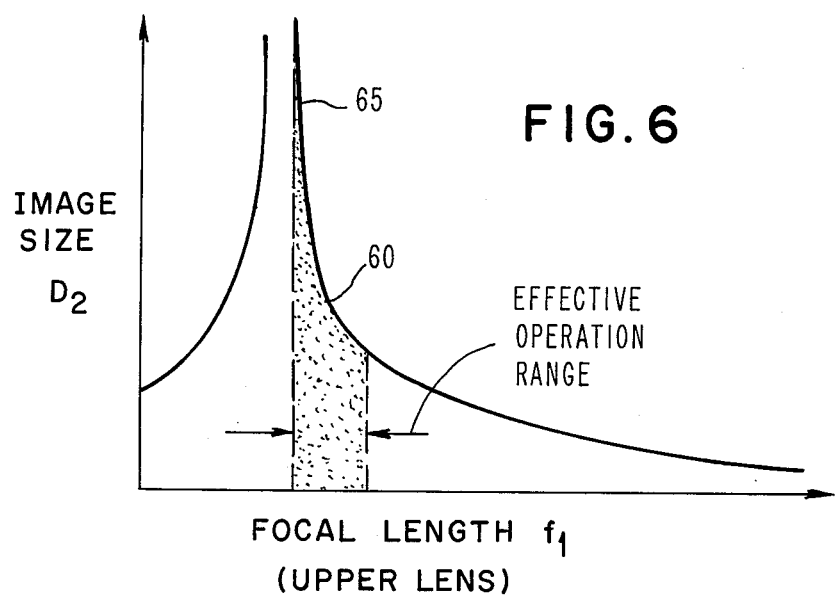
FIG. 6 is a graphical representation of the image size versus focal length for the twin Einzel lens combination of FIG. 4.

FIG. 6 is a graphical representation of the output image size $D_2$ of the twin Einzel lens unit 20 versus the focal length $f_1$ of lens L1 with the focal length $f_2$ adjusted accordingly to keep the image position of $D_2$ at a fixed plane. It will be observed that when the lens is operated on the steep portion of the focal length curve, e.g., between 60 and 65, very large changes in the image size $D_2$ occur with very small changes in focal length $f_1$. Since the focal lengths $f_1$ and $f_2$ are altered by changing the magnitude of the bias voltage on center discs 22 and 25 of lens L1 and L2, very large changes in the size of image $D_2$ are effected by small changes in the bias voltage. The small changes in bias voltage and the low capacitance of center discs enables the image size to be altered with great speed while the beam is in motion.

The magnified electron beam from the electron optical imaging unit 20 enters the electron optical column 30 where it is treated as the new source and demagnified to form the final beam diameter $D_3$ upon the target 40. While the twin Einzel lens unit is shown in the preferred embodiment as being placed between the electron gun 10 and the electron optical column 30, it can also be placed within the optical column to produce the same result. The electron optical column 30 comprises the lenses normally found in the prior art electron beam system and will not be described in detail herein.

Electromagnetic lenses could be used in place of the Einzel lenses in the electron optical imaging unit 20 since the relationship between focal length and magnification ratio given by equations 3 and 4 are the same for both types of lenses. However, the Einzel lens unit is preferred because it is an electrostatic lens and its focal length can be varied much faster than the focal length of an electromagnetic lens. The only limitation on the speed of operation of the electrostatic lens is the capacitance between the discs of the lens, while the speed of the electromagnetic lens is controlled by the inductance of the lens coil. Typically the electrostatic lens operates in the range of microseconds while the electromagnetic lens operates in milliseconds.

Figure 7:
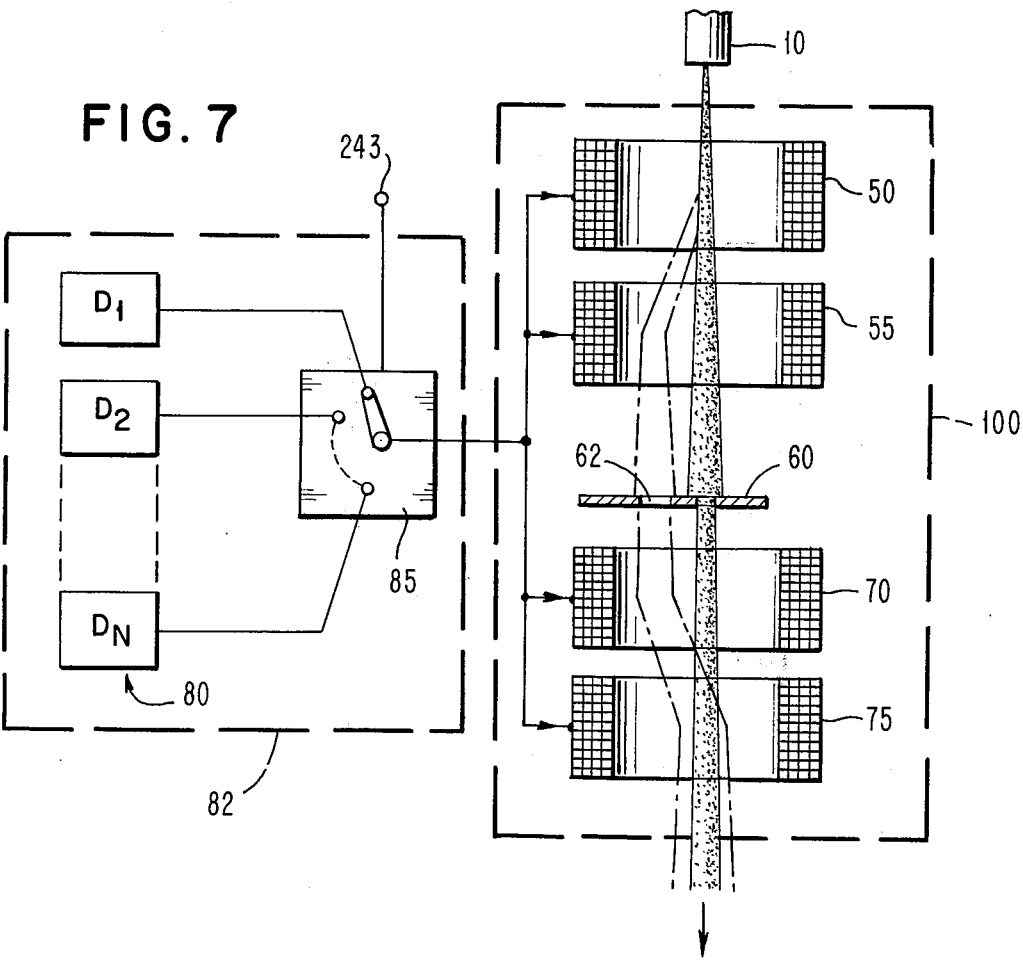
FIG. 7 shows an embodiment of the invention using multiple size apertures.

FIG. 7 shows an alternative method for dynamically altering the size of the electron beam in an electron-beam microelectronic circuit fabrication apparatus. The limiting aperture in the electron optical column of the typical electron-beam system is replaced by an aperture tray 60 containing an array of apertures of the desired sizes. One set of deflection units 50 and 55 is provided above the aperture tray 60 and another set of deflection units 70 and 75 is provided below aperture tray 60. The deflection units may be either electrostatic or electromagnetic. Deflection control means 82 comprising deflection drivers 80 and switch means 85 determine which aperture of aperture tray 60 the electron beam is to be deflected through in accordance with input control signals on line 243. Deflection unit 50 obliquely deflects the electron beam from its central axis of travel in the electron optical column when it is desired to pass the beam through a different aperture while deflection unit 55 deflects the beam parallel to the central axis of travel in order to ensure proper entry into the new aperture. A larger limiting aperture, e.g., aperture 62, increases the beam current by increasing the semiangular aperture which introduces more spherical and chromatic aberrations into the beam and thus also increases the beam size. After the electron beam exits from the aperture tray 60, lower deflection unit 70 obliquely deflects the beam back toward the central axis of the electron optical column and deflection unit 75 deflects the beam onto the central axis of travel. The beam then completes its travel to the target in a conventional manner.

It is understood that mechanical means could be provided to move the aperture tray such that the desired aperture size could be placed in the central axis of the electron-optical column, rather than deflecting the electron beam as disclosed. However, it is preferred to deflect the electron beam since deflection of the beam can be accomplished at higher speeds than mechanical movement of the tray and speed is essential to the efficient operation of this invention.

OPERATION OF THE INVENTION

Figure 8:
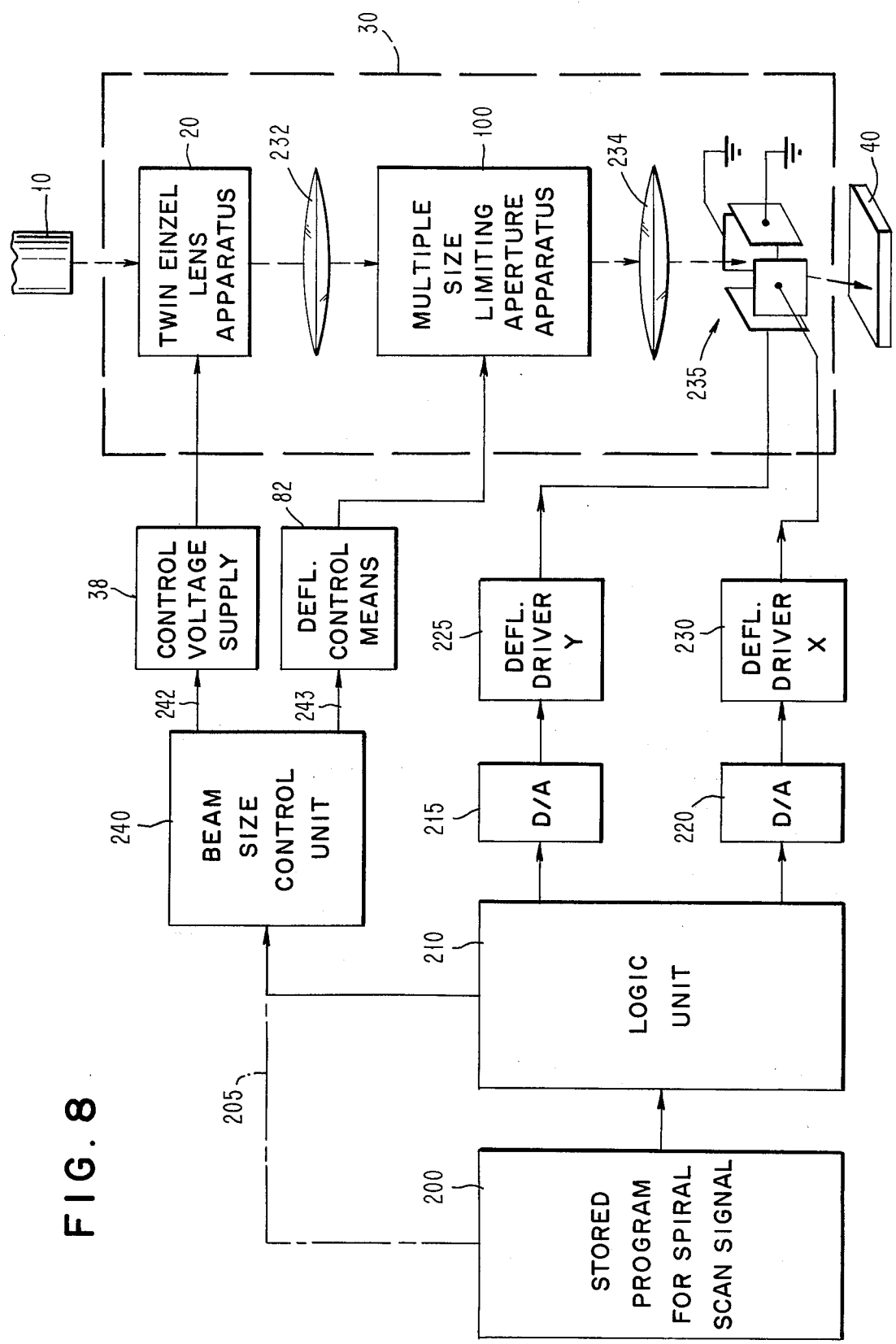
FIG. 8 is a block diagram of an electron beam microcircuit fabrication system incorporating the present invention.

The operation of the preferred method of changing the electron beam size in an electron-optical microelectronic circuit fabrication system is described with reference to FIGS. 3 and 8. A program describing vector spiral motion to be executed by the electron beam in order to produce the circuit pattern of FIG. 3 is stored in program storage unit 200 of FIG. 8. The program steps are decoded by logic unit 210 to produce the $x$ and $y$ coordinate points for the spiral scan segments of the circuit pattern. The coordinate points are decoded by D/A converters 215 and 220 to drive the $x$ and $y$ deflection drivers 225 and 230 of the final deflection unit 235 in the electron optical column 30. The deflection unit 235 positions the beam on target 40 in accordance with the stored circuit pattern.

The electron beam apparatus outlines the circuit pattern in a spiral scan motion in accordance with the stored program using a beam of a predetermined size 13 in order to ensure good edge definition. When the scanning beam reaches point 14 in its initial spiral, logic unit 210 signals beam size control unit 240 to dynamically enlarge the size of the scanning electron beam. Alternatively, the beam size control signal may be derived from the program storage unit 200 and transmitted to the beam size control unit via cable 205. The output from the beam size control unit 240 controls either the electron optical imaging unit 20 through cable 242 or multiple size limiting aperture apparatus 100 through cable 243 to dynamically enlarge the size of the scanning electron beam.

Assuming that the system includes the twin Einzel lens unit 20, the signal from the beam size control unit 240 along cable 242 controls the switch network 35 to vary the bias voltages on lens center discs 22 and 25 to magnify the input electron beam $D_o$ to produce enlarged beam $D_2$. Electron beam $D_2$ is demagnified and focused by the condenser lens 232 and objective lens 234 in electron optical column 30 to produce beam $D_3$ of size 15 on target 40 as shown in FIG. 3. The beam of size 15 is then controlled by the logic unit 210 to fill in the inside of the circuit pattern in accordance with the programmed spiral scan motion.

In the alternative, if the system includes the multiple size limiting aperture apparatus 100, the signal from the beam size control unit 240 along cable 243 controls remote controlled switch unit 85 to select one of deflection drivers 80 to energize deflection units 50, 55, 70, and 75. Deflection units 50 and 55 deflect the electron beam from its path through the small aperture used to produce a beam of size 13 to outline the circuit pattern through a larger aperture 62 to produce a beam of size 15 for use in filling in the circuit pattern. The deflection units 70 and 75 return the beam to its path along the center axis of the electron optical column 30. The electron beam is imaged as it passes through the objective lens 234 and controlled by the logic unit 210 through the deflection unit 235 to fill in the inside of the circuit pattern in accordance with the programmed spiral scan motion.

While my invention has been particularly shown and described with reference to the preferred embodiments thereof, it will be understood by those skilled in the art, that the foregoing use of electromagnetic lens instead of the twin Einzel lens unit and mechanical movement of the aperture as opposed to deflection of the electron beam modifications suggested and other changes in form and detail may be made without departing from the spirit and scope of my invention which is a method for electron beam writing of microcircuit patterns utilizing spiral scan motion and variable beam sizes.

What I claim is:

1. A method of fabricating integrated circuits in a computer controlled electron beam system comprising the steps of:
   providing a programmed integrated circuit pattern;
   directing a beam of electrons of a predetermined diameter toward a target so as to impinge on the target in accordance with said integrated circuit pattern;
   interposing an electron optical imaging unit in the path of said beam of electrons;
   operating said imaging unit so as not to alter the predetermined diameter of the beam of electrons;
   outlining the circuit pattern;
   operating said imaging unit so as to magnify the diameter of the beam of electrons; and
   filling in the inside of the circuit pattern.

2. The method of fabricating integrated circuits of claim 1 wherein said step of outlinging the circuit pattern is in a vector spiral scan motion.

3. The method of fabricating integrated circuits of claim 2 wherein said step of filling in the inside of the circuit pattern is in a vector spiral scan motion.

4. A method of fabricating integrated circuits in a computer controlled electron beam system comprising:
   providing a programmed integrated circuit pattern;
   directing a beam of electrons of a predetermined diameter toward a semiconductor wafer in accordance with said integrated circuit pattern;
   interposing an electron optical imaging unit comprised of two electrostatic lenses in the path of said beam of electrons;
   arranging said lenses so that the overall magnification ratio is dependent on the focal lengths of the two lenses;
   setting the focal lengths of said lenses so that the overall magnification ratio gives the predetermined beam diameter on the target;
   outlining the circuit pattern;
   adjusting the focal lengths of the lenses to magnify the diameter of said beam of electrons; and
   filling in the inside of the circuit pattern.

5. The method of claim 4 wherein outlining of the circuit pattern is in a vector spiral scan motion.

6. The method of claim 5 wherein filling in the inside of the circuit pattern is in a vector spiral scan motion.

7. The method of claim 4 wherein said electrostatic lenses are Einzel lenses.

8. A method of fabricating integrated circuits in a computer controlled electron beam system comprising:
   providing a programmed integrated circuit pattern;
   directing a beam of electrons toward a target so as to impinge on said target in accordance with said integrated circuit pattern;
   interposing an aperture tray containing an array of multiple size apertures in the path of said electron beam;
   juxtaposing a pair of electronic deflection units on either side of said aperture tray in the path of said electron beam;
   deflecting said electron beam through a smaller diameter one of said multiple size apertures in said aperture tray;
   outlining the circuit pattern;
   deflecting said electron beam through a larger diameter one of said multiple size apertures; and
   filling in the inside of circuit pattern.

9. The method of claim 8 wherein outlining the circuit pattern is in a vector spiral scan motion.

10. The method of claim 8 wherein filling in the circuit pattern is in a vector spiral scan motion.

* * * * *